United States Patent
Patel et al.

(10) Patent No.: US 6,306,751 B1
(45) Date of Patent: Oct. 23, 2001

(54) APPARATUS AND METHOD FOR IMPROVING BALL JOINTS IN SEMICONDUCTOR PACKAGES

(75) Inventors: Sunil A. Patel, Los Altos; Chok J. Chia, Cupertino; Kishor V. Desai, Fremont, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/406,308

(22) Filed: Sep. 27, 1999

(51) Int. Cl.[7] .................................................. H01L 21/44
(52) U.S. Cl. ...................... 438/614; 438/108; 438/612; 438/613; 228/180.22
(58) Field of Search ..................................... 438/108, 612, 438/613, 614, 617, 652, 106, 653, FOR 347; 282/180.22

(56) References Cited

U.S. PATENT DOCUMENTS

| | | | |
|---|---|---|---|
| 5,585,282 | * 12/1996 | Wood et al. | 438/613 |
| 5,686,764 | 11/1997 | Fulcher | 257/778 |
| 5,767,010 | * 6/1998 | Mis et al. | 438/614 |
| 5,805,427 | 9/1998 | Hoffman | 361/770 |
| 5,866,949 | 2/1999 | Schueller | 257/778 |
| 5,891,756 | 4/1999 | Erickson | 438/108 |
| 5,909,057 | 6/1999 | McCormick et al. | 257/704 |
| 5,923,047 | 7/1999 | Chia et al. | 257/48 |
| 5,933,752 | * 8/1999 | Yanagida | 438/613 |
| 6,114,239 | * 9/2000 | Lake et al. | 438/653 |

FOREIGN PATENT DOCUMENTS 1-286333 * 11/1989 (JP).

* cited by examiner

*Primary Examiner*—Olik Chaudhuri
*Assistant Examiner*—Alonzo Chambliss

(57) ABSTRACT

Provided is an apparatus and method for modifying the manufacture of chip carrier bond pads to increase the quality and reliability of semiconductor packages and ball joints in particular. This is accomplished by minimizing the corrosion of the barrier metal layer on the functional bond pads during gold deposition with the use of sacrificial pads electrically connected with the functional bond pads. According to one embodiment of the invention, a semiconductor package has copper conductive pads on a substrate that are exposed through a dielectric. Both functional and sacrificial (nonfunctional) copper conductive pads are provided. A barrier metal layer composed of nickel is electrolessly plated onto these conductive pads, and a bond metal layer of gold is deposited onto the nickel using electroless, generally immersion, gold plating. The surface area of the nickel on the sacrificial pads is less than that on the functional pads, and the nickel on the sacrificial pads corrodes first during electroless gold deposition. Without nickel corrosion on the functional bond pad, gold can more uniformly be deposited on the surface of the nickel layer. A eutectic solderable material placed on the gold can form a uniform bond with the nickel because the nickel on the functional bond pad is largely corrosion free.

11 Claims, 3 Drawing Sheets

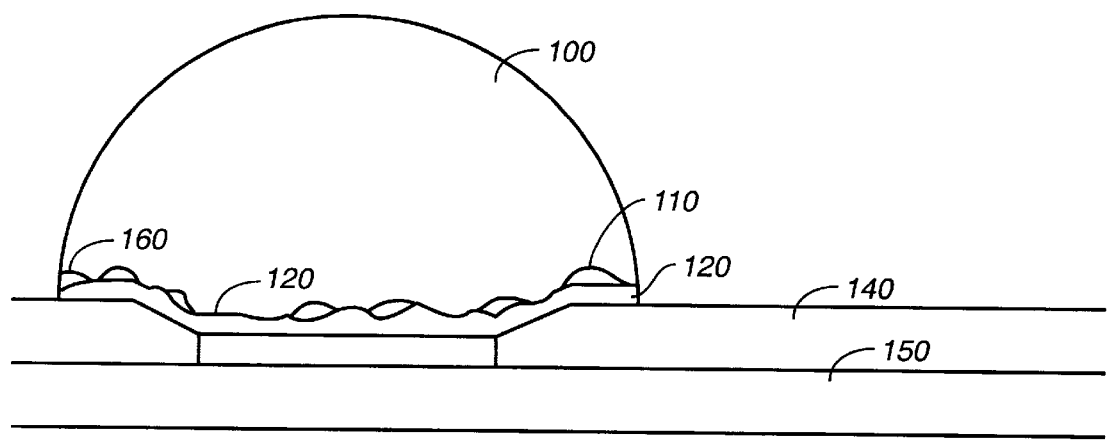
FIG._1
(PRIOR ART)
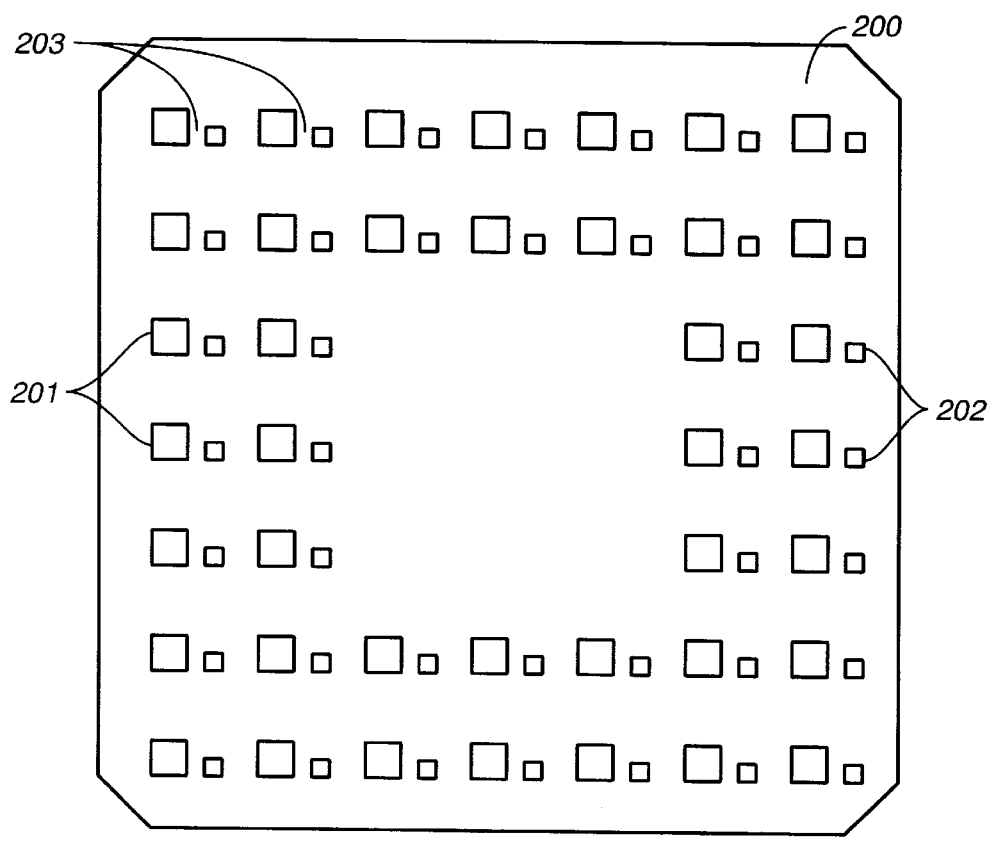
FIG._2

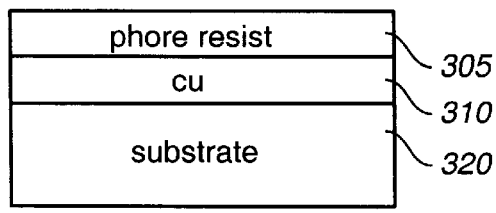
*FIG._3A*
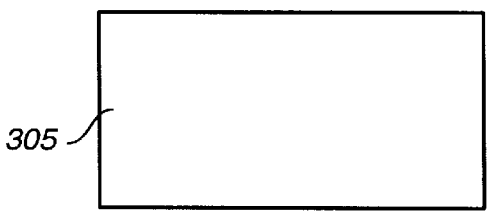
*FIG._3A(i)*
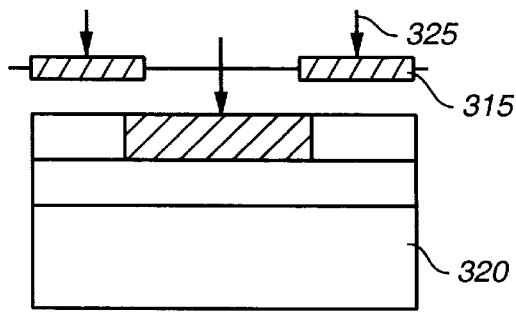
*FIG._3B*
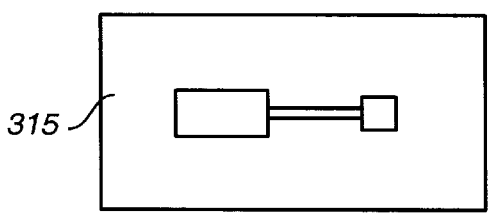
*FIG._3B(i)*
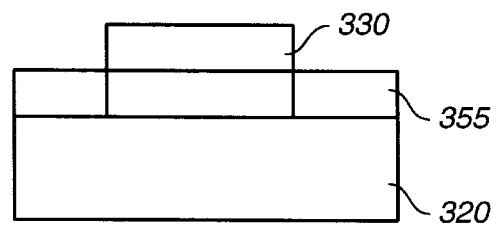
*FIG._3C*
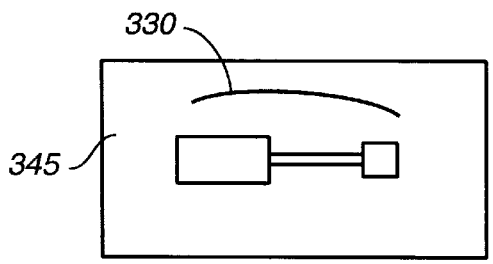
*FIG._3C(i)*
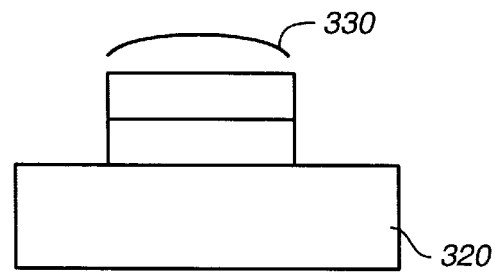
*FIG._3D*
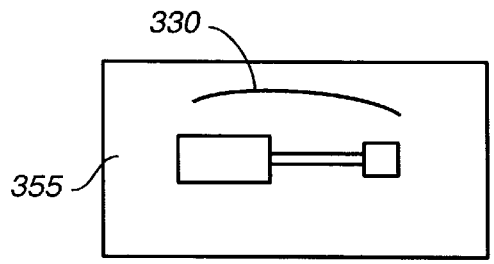
*FIG._3D(i)*
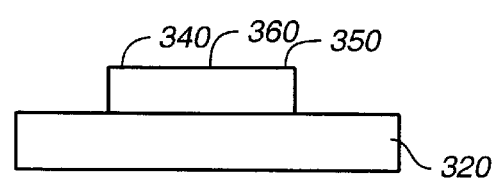
*FIG._3E*
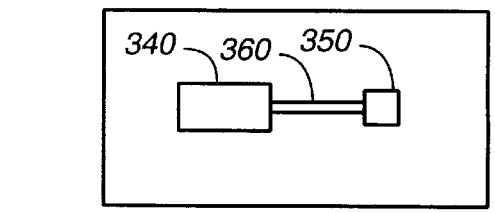
*FIG._3E(i)*

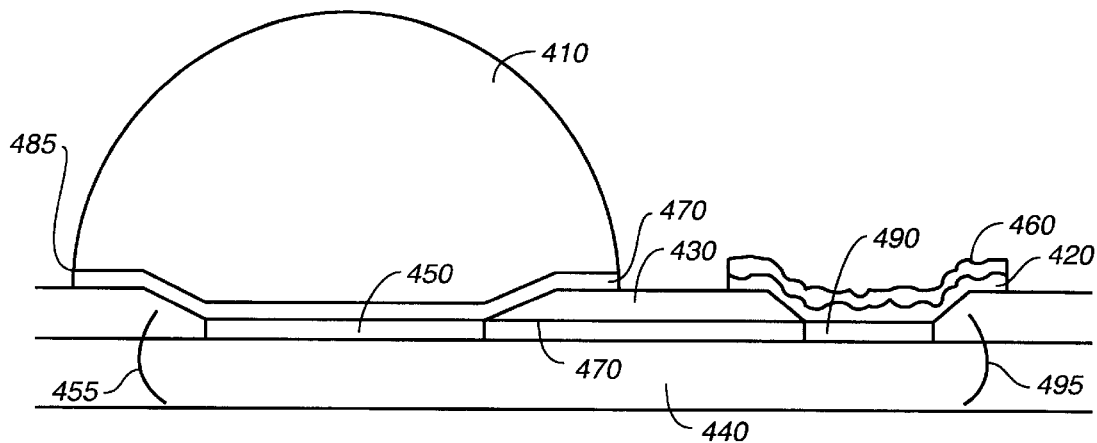
FIG._4
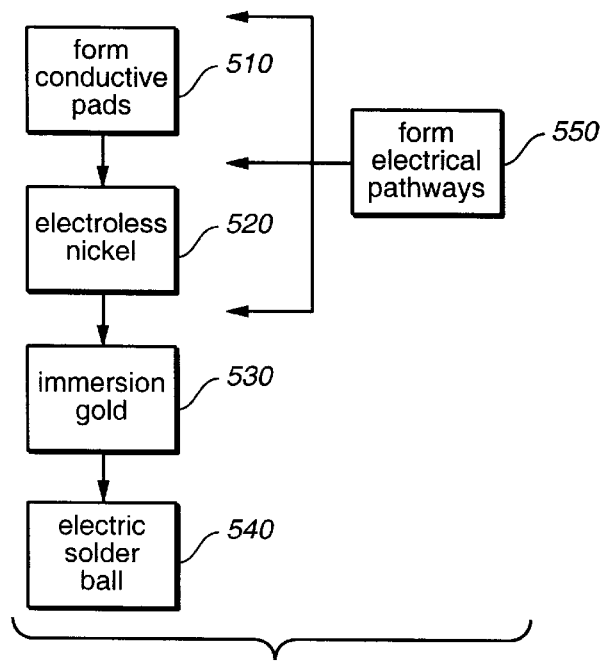
FIG._5

ut # APPARATUS AND METHOD FOR IMPROVING BALL JOINTS IN SEMICONDUCTOR PACKAGES

BACKGROUND OF THE INVENTION

This invention relates generally to semiconductor packaging. More specifically, the invention relates to the design and manufacturing process of chip carrier bond pads which increase the quality and reliability of the interconnections between semiconductor chips and circuit boards.

Ball grid array (BGA), chip-scale package (CSP), and solder-bumped flip chip technologies are all commonly used packaging technologies where solder is the electrical and mechanical "glue." Solder joint reliability is one of the most critical issues in the development of these technologies.

A semiconductor package can have conductive beads forming these solder joints. These electrically conductive beads can be in the form of solder balls. For example, a ball grid array (BGA) process can be used to apply solder balls to the underside of a semiconductor package for subsequent bonding of the package to a circuit board for use. A BGA package is placed so that each solder bump of the BGA package contacts the corresponding pads on the circuit board. The solder is heated to induce reflow and electrical connections. These connections serve to secure the semiconductor package to the printed circuit board and to electrically interconnect at least one semiconductor chip carried in the semiconductor package with the metallizations on the circuit board. Such semiconductor packages are used extensively in the electronics industry because of their compact size, ease of mounting, and versatility.

Ball grid array packages are available in a variety of different configurations and substrate materials. These include Ceramic Ball Grid Arrays (CBGA), Ceramic Column Grid Arrays (CCGA), Tape Ball Grid Arrays (TBGA), and Plastic Ball Grid Arrays (PBGA).

The solder pads for a BGA package, chip-scale package (CSP) or for flip chips, which are unpackaged semiconductor carriers whose bonding pads bear solder bumps which are substantially truncated-sphere-shaped solidified solder, are often currently manufactured in a process that involves depositing nickel and subsequently gold on the surface of copper exposed through a dielectric layer. It is well known in the art that electroless and electrolytic plating processes can be used for depositing nickel, and electroless, typically immersion, and electrolytic processes can be used for depositing gold. The copper at the bond pad interface can be deposited or electroplated. Solder balls for semiconductor package interconnects are often composed of a eutectic tin-lead alloy. These tin-lead balls form an intermetallic compound with nickel when soldered onto the bond pad.

Electroless nickel metallization can occur after the cooper has been deposited, imaged and etched and can occur before or after the application of soldermask. Nickel covers all exposed copper surfaces and acts as a barrier between the copper and the subsequently deposited gold. This nickel layer is required to prevent the formation of a compound between gold and copper that can not be soldered. The nickel also adds strength to the bond pad. This process is well known in the art, as described in U.S. Pat. No. 5,891,756, for example, the entire specification of which is incorporated herein by reference for all purposes.

Immersion gold plating occurs after the electroless nickel plating and after etching. Gold covers all exposed nickel surfaces and acts as a bond metal. The immersion (electroless) gold plating process has distinct advantages over its electrolytic counterpart. For example, the immersion gold process has the capability of depositing a much thinner layer of gold than the electrolytic process.

In the immersion gold process, the gold can also fully cover the nickel because electroless nickel and immersion gold can be performed after etching, as no electrical connections for electrolytic nickel or gold plating are required. However, it is well known in the art that during electroless deposition of gold, corrosion of the nickel barrier layer often occurs due to the electrochemical nature of the process. The corrosion of the nickel layer results in nonuniform gold deposition. Excess gold may not be completely soluble during reflow and attachment of the solder balls causing a weak ball joint. Excess gold also prevents the solder balls from forming an intermetallic compound with the nickel.

FIG. 1 illustrates how the corrosion of the nickel may occur when convention device designs and methods are used. FIG. 1 is a cross-sectional view of a ball joint on a bond pad. A conductive pad 130, commonly made of copper or aluminum, is formed on a substrate 150. This conductive pad 130 can be treated to allow better nickel adhesion when electroless nickel plating occurs. Micro-etching can clean the surface of the conductive pad as well as create a toothed structure on the surface of the conductive pad. A catalyst can also be applied to further increase the ability of nickel to adhere to the pad.

Nickel 120 can then be electrolessly plated onto the pad 130. A common deposition rate for the nickel bath is approximately 10 microinches per minute. A nickel 120 layer thickness of 50–250 microinches is often specified to prevent a subsequently deposited gold layer from diffusing into the copper. Nickel provides good hardness, uniformity, and corrosion resistance.

Unfortunately, nickel 120 itself may corrode when the immersion gold process deposits gold 110 onto the surface of nickel. A layer of gold 4–7 microinches thick is common and is a possible result of the immersion gold process. However, corrosion of nickel 120 during immersion gold results in uneven deposition of gold 110. Too little gold 110 is deposited where the nickel 120 is corroded and too much is deposited where the nickel 160 is not corroded. This unevenly deposited layer of gold may not be completely soluble during reflow (i.e., where gold deposition is too thick), and a eutectic solder ball 100 often comprised of tin-lead cannot form a complete interconnection with the nickel 120. This incomplete connection, results in dewetting, poor adhesion, and low reliability.

In an ideal solder joint, the surface is wetted when the solder is heated and the result is a continuous, unbroken film. With excess gold deposition, dewetting may result where the solder balls appear to have wetted the surface of the nickel but leave an irregular, nonuniform joint.

Accordingly, what is needed are methods and apparatuses for improving the reliability of semiconductor packages by providing more reliable ball joints to minimize dewetting during soldering and to increase the adhesiveness of the intermetallic bond formed between the solder ball and the barrier metal.

SUMMARY OF THE INVENTION

To achieve the foregoing, the present invention provides an apparatus and method for modifying the manufacture of chip carrier bond pads to increase the quality and reliability of semiconductor packages and ball joints in particular is provided. This is accomplished by minimizing the corrosion of the nickel on the functional bond pads during gold deposition with the use of sacrificial pads electrically connected with the functional bond pads.

According to one embodiment of the invention, a semiconductor package has copper conductive pads on a substrate that are exposed through a dielectric. Both functional and sacrificial (nonfunctional) copper conductive pads are provided. In a preferred embodiment, each bond pad is individually connected to a sacrificial pad, however, other configurations are also possible. Nickel is electrolessly plated onto these conductive pads to provide a barrier layer, and gold is deposited onto the nickel using electroless, generally immersion, gold plating. The surface area of the nickel on the sacrificial pads is less than that on the functional pads, and the nickel on the sacrificial pads corrodes first during electroless gold deposition.

Without nickel corrosion on the functional bond pad, gold can more uniformly be deposited on the surface of the nickel layer. A eutectic solderable material placed on the gold can form a uniform bond with the nickel because the nickel on the functional bond pad is largely corrosion free. In one embodiment of the invention, the sacrificial bond pads would remain exposed, although no solder ball would be bonded to these sacrificial pads.

In one aspect, the invention provides a semiconductor package having an array of conductive pads on a substantially planar surface of the package. The array includes a plurality of bond pads and a plurality or sacrificial pads electrically connected with the bond pads.

In another aspect, the invention provides a method for producing a semiconductor package. The method involves forming a plurality of bond pads on a packaging substrate, forming a plurality of sacrificial pads on the, and providing electrical connections between the bond and sacrificial pads.

This invention yields a semiconductor package solder bump pad that has higher quality and reliability than those processed without using sacrificial bond pads. Accordingly, this invention avoids the disadvantages of electrolytic gold deposition, limits the cost of additional materials, and does not require any additional processing steps. This invention improves the accuracy and integrity of the ball joints required for semiconductor package bonding techniques.

A further understanding of the nature and advantages of the present invention may be realized by reference to the remaining portions of the specification and the drawings.

BRIEF DESCRIPTION OF THE DRAWINGS

FIG. 1 illustrates a bond pad bonded to a solder ball in accordance with conventional practice.

FIG. 2 shows an arrangement of bond pads and sacrificial pads on the circuit board face of a chip package in accordance with one embodiment of the present invention.

FIGS. 3A–3E(i) show top and side views of a bond and sacrificial pad formation process in accordance with one embodiment of the present invention.

FIG. 4 shows a bond pad electrically connected with a sacrificial pad and bonded to a solder ball in accordance with one embodiment of the present invention.

FIG. 5 is a process flow method of manufacturing a bond pad array on a semiconductor package according to one embodiment of the present invention.

DETAILED DESCRIPTION OF SPECIFIC EMBODIMENTS

Reference will now be made in detail to a preferred embodiment of the invention. An example of the preferred embodiment is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as may be included within the spirit and scope of the invention as defined by the appended claims.

The present invention provides an apparatus and method for modifying the manufacture of chip carrier bond pads to increase the quality and reliability of semiconductor packages and ball joints in particular is provided. This is accomplished by minimizing the corrosion of the nickel on the functional bond pads during gold deposition with the use of sacrificial pads electrically connected with the functional bond pads.

According to one embodiment of the invention, a semiconductor package has copper conductive pads on a substrate that are exposed through a dielectric. Both functional and sacrificial ("nonfunctional") copper conductive pads are provided. In this invention, functional conductive pads generally refer to those pads that connect metallizations on a semiconductor chip the package carries with a metallization on the circuit board. Nonfunctional or "sacrificial" conductive pads generally refer to those conductive pads that do not electrically connect metallizations on a semiconductor chip with those on a circuit board.

Conductive material electrically connects the functional pads with metallizations that mount the semiconductor chip. Functional bond pads are also electrically connected with sacrificial pads. In a preferred embodiment, each bond pad is individually connected to a sacrificial pad, however, other configurations are also possible. A barrier layer, preferably composed of nickel, is electrolessly plated onto these conductive pads, and a bond metal layer, preferably of gold, is deposited onto the nickel using electroless, generally immersion, gold plating.

According to a preferred embodiment of the invention, the surface area of the nickel on the sacrificial pads is less than that on the functional pads, and the nickel on the sacrificial pads corrodes first during electroless gold deposition. According to another embodiment of the invention, the immersion gold process takes place in an electrical field and the potentials during electrochemical plating cause the sacrificial pad to corrode faster than the functional pad. In still another embodiment of the invention, both potentials and surface areas are optimized to leave the nickel on the functional bond pad largely free of corrosion.

Without nickel corrosion on the functional bond pad, gold can more uniformly be deposited on the surface of the nickel layer. A eutectic solderable material placed on the gold can form a uniform bond with the nickel because the nickel on the functional bond pad would be largely corrosion free. In a preferred embodiment of the invention, the sacrificial bond pads would remain exposed, although no solder ball would be bonded to these sacrificial pads.

FIG. 2 shows an arrangement of bond pads 201 and sacrificial pads 202 on the circuit board face of a chip package 200 in accordance with one embodiment of the present invention. Each bond pad 201 is electrically connected with a single sacrificial pad 202 by an electrical pathway 203. In one embodiment of the invention, all of the sacrificial pads have a smaller surface area than the functional pads 201. It should be noted that this figure and the figures that follow are intended to be representative and, for example, do not show the solder pads 201 in proportion to the semiconductor package surface 200. In current designs, the die may have dimensions on the order of 0.5×0.5 inch (1 inch=2.54 cm) whereas the unbonded solder balls may have a diameter on the order of 4 to 5 mils (1 mil=$10^{-3}$ inch= 0.0254 mm).

In one embodiment of this invention, the conductive material can be made of the same materials as the bond pads and be formed during the formation of the pads. The bond and sacrificial pads can also be wired together through the use of vias.

FIGS. 3A–3E(i) show top and side views of a preferred method whereby the manufacturing of the pathway requires no additional steps in the process of forming these bond and sacrificial pads. As shown in FIGS. 3A and 3A(i), photoresist 305 can be applied to the surface of a copper top metal layer 310 covering a substrate 320. A photomask 315 can be aligned above the photoresist and exposed to light 325, as shown in FIGS. 3B and 3B(i). The photoresist that remains unpolymerized 345 is removed, and the polymerized resist 330 remains, as shown in FIGS. 3C and 3C(i). An etching process may then remove copper 355 that is uncovered by photoresist, as shown in FIGS. 3D and 3D(i). FIGS. 3E and 3E(i) show the bond pad 340 connected to the sacrificial pad 350 by the electrical pathway 360 formed on the substrate 320. Using this method, the photomask can be patterned to allow the formation of arrays of such bond and sacrificial pads of various configurations.

FIG. 4 is a cross sectional view of a ball joint on a bond pad that is electrically connected to a sacrificial pad in accordance with one embodiment of the present invention. After the top metal layer of the bond pads and sacrificial pads and the connective pathways have been formed, these pads can be surrounded by a dielectric 430. The copper 450 and 490 can be treated to allow better nickel adhesion when electroless nickel plating occurs. Micro-etching may be used to clean the surface of the conductive pad as well as to create a toothed structure on the surface of the conductive pad. A catalyst may also be applied to further increase the ability of nickel to adhere to the pad. A bond pad 450 is electrically connected to sacrificial pad 490 through the use of conductive material 470. A barrier layer 470 and 420, preferably nickel, may be electrolessly plated onto conductive pads 450 and 490. A common deposition rate for the nickel bath is approximately 10 microinches per minute. A nickel 470 and 420 layer thickness of 50–250 microinches is often specified to prevent a subsequently deposited gold layer from diffusing into the copper top metal layer.

To prevent corrosion of the nickel layer, the conductive pad 495 acts as a sacrificial pad for functional pad 455 during electroless gold plating. In one embodiment of the invention, the nickel 420 on sacrificial pad 495 has a smaller surface area than the nickel 470 on functional pad 455. Since the nickel 420 has a smaller surface area than nickel 470, nickel 420 corrodes faster than nickel 470 during immersion gold plating. In another embodiment of the invention, the immersion gold process occurs in an electric field, and the potentials are set to allow the functional nickel pad 470 to remain largely free of corrosion while the sacrificial nickel pad 420 becomes corroded.

The nickel layer 470 on the bond pad that remains largely free of corrosion allows immersion gold plating to cover the nickel layer 470 with a layer of gold with uniform thickness. The layer of gold 460 at the sacrificial pad 495 however, is uneven due to the corrosion of the nickel layer 420. In one embodiment of the invention, a eutectic tin-lead ball is soldered onto the gold at 485. Since the layer of gold is uniform, the tin present in the solder can form an intermetallic compound with nickel at 485 allowing strong adhesion between the solder ball 410 and the nickel layer 470.

FIG. 5 illustrates one particular method of practicing the invention. One skilled in the art will realize that this method is not the only way of practicing the invention. One skilled in the art will also recognize that variations in the method are possible to allow additional steps or changes in the order of steps, for example, cleansing and rinsing of semiconductor bond areas is common after each particular step. In one embodiment of this invention, the formation of conductive pads 510 can occur simultaneously with the formation of pathways 550 electrically connecting bond and sacrificial pads. In another embodiment, the formation of these pathways 550 can occur before or after the formation of bond pads. After the formation of these conductive pads, an electroless nickel procedure 520, such as are well known in the art and described above, may be used to cover the surface of copper with nickel in order to prevent gold from diffusing into the conductive metal. Micro-etching and the application of a catalyst may be used to improve the adhesiveness of a conductive pad such as copper or aluminum to a barrier metal such as nickel. An immersion or other electroless gold process 530 can then plate the surface of nickel to complete an array of bond and sacrificial pads. Such an array allows the eutectic solder ball process 540 to bond lead-tin solder balls with the nickel in the barrier layer to form a BGA.

While the invention has been particularly shown and described with reference to specific embodiments thereof, it will be understood by those skilled in the art that changes in the form and details of the disclosed embodiments may be made without departing from the spirit or scope of the invention. For example, some embodiments have been described with reference to the arrangement and interconnection patterns between the bond and sacrificial pads. It will be understood, however, that a wide variety of arrangements for the bond and sacrificial pads are available, and some bond pads may be connected with multiple sacrificial pads or indeed be interconnected with each other, depending on the desired characteristics of the chip package. Interconnections between bond and sacrificial pads can also take many forms. Also, even though the bond pads of the present invention have been described with rectangular surface areas, a wide range of other bond and sacrificial pad shapes are possible.

Although the foregoing invention has been described in some detail to facilitate understanding, it will be apparent that certain changes and modifications may be practiced within the scope of the appended claims. Furthermore, it should be noted that there are alternative ways of implementing both the process and apparatus of the present invention. Accordingly, the present embodiment are to be considered as illustrative and not restrictive, and the invention is not to be limited to the details given herein, but may be modified within the scope and equivalents of the appended claims.

What is claimed is:

1. A method for producing a semiconductor package comprising:

forming a plurality of bond pads on a packaging substrate;

forming a plurality of sacrificial pads on said substrate wherein said sacrificial pads do not electrically connect metallization on said packaging substrate with metallization on a circuit board;

providing electrical connections between said bond and sacrificial pads; wherein the step of forming said bond and sacrificial pads comprises:

depositing a first layer of material on the bond and sacrificial pads, wherein the first layer of material comprises a metal; and after the step of depositing the first layer of material, depositing a second layer of material on the bond and sacrificial pads, wherein the second layer of material comprises a metal.

2. The method of claim 1, wherein each of said plurality of bond pads is individually electrically connected with a single sacrificial pad.

3. The method of claim 1, wherein forming said bond and sacrificial pads on said substrate further comprises:

forming a top metal layer on a package substrate;

forming a solder mask on said top metal layer for patterning of conductive pads on the top metal layer.

4. The method for producing a semiconductor package of claim 3, wherein said bond and sacrificial pads are electrically connected by said top metal layer.

5. The method of claim 3, wherein said top metal layer is selected from copper and aluminum.

6. The method of claim 5, wherein the nickel on said sacrificial pads is substantially more corroded than the nickel on said bond pads during said gold deposition.

7. The method of claim 3, wherein said electroless gold deposition is conducted by gold immersion.

8. The method of claim 3, wherein the deposition of at least one bond metal onto said barrier metal causes substantially more corrosion of said barrier metal deposited on said sacrificial pads than on said bond pads.

9. The method of claim 3, wherein:

the step of depositing the first layer comprises electrolessly depositing at least one barrier metal layer onto said bond and sacrificial pads; and the step of depositing the second layer comprises electrolessly depositing at least one bond metal layer onto said barrier metal layer.

10. The method of claim 1, wherein said bond pads are bonded to solder balls and said sacrificial pads are not bonded to solder balls.

11. The method of claim 9, wherein said barrier metal layer is nickel and said bond metal is gold.

* * * * *